United States Patent [19]

Norimatsu

[11] Patent Number: 5,329,577
[45] Date of Patent: Jul. 12, 1994

[54] TELEPHONE HAVING TOUCH SENSOR FOR RESPONDING TO A CALL

[75] Inventor: Hidehiko Norimatsu, Tokyo, Japan

[73] Assignee: NEC Corporation, Tokyo, Japan

[21] Appl. No.: 998,652

[22] Filed: Dec. 29, 1992

Related U.S. Application Data

[63] Continuation of Ser. No. 474,910, Feb. 5, 1990, abandoned.

[30] Foreign Application Priority Data

Feb. 3, 1989 [JP] Japan .................................. 1-23713

[51] Int. Cl.$^5$ .......................................... H04M 11/00
[52] U.S. Cl. ........................................ 379/58; 379/61;
200/DIG. 2; 341/22
[58] Field of Search ....................... 379/57, 58, 96, 61;
200/DIG. 2; 341/22, 33, 34; 340/562

[56] References Cited

U.S. PATENT DOCUMENTS

| 3,668,659 | 6/1972 | Hutchings. | |
|---|---|---|---|
| 3,705,424 | 12/1972 | Harvey, Jr. | 200/DIG. 2 X |
| 3,728,501 | 4/1973 | Larson et al. | 200/DIG. 2 X |
| 3,737,670 | 6/1973 | Larson | 200/DIG. 2 X |
| 3,811,054 | 5/1974 | Wern et al. | 340/562 X |
| 3,944,843 | 3/1976 | Vaz Martins | 200/DIG. 2 X |
| 4,237,421 | 12/1980 | Waldron | 340/562 X |
| 4,281,323 | 7/1981 | Burnett et al. | 341/33 X |
| 4,550,310 | 10/1985 | Yamaguchi et al. | 341/33 X |
| 4,567,470 | 1/1986 | Yoshikawa et al. | 341/33 |
| 4,651,133 | 3/1987 | Ganesan et al. | 341/33 X |
| 4,725,817 | 2/1988 | Wihlborg | 341/34 |
| 4,827,085 | 5/1989 | Yaniv et al. | 379/96 X |
| 4,831,279 | 5/1989 | Ingraham | 340/562 X |
| 4,848,887 | 7/1989 | Suzuki et al. | 379/58 |
| 4,870,676 | 9/1989 | Leno | 379/58 |
| 4,870,696 | 9/1989 | Yorita | 379/57 X |

FOREIGN PATENT DOCUMENTS

| 0213929 | 11/1987 | European Pat. Off. . | |
|---|---|---|---|
| 0283853 | 9/1988 | European Pat. Off. . | |
| 0100381 | 8/1981 | Japan | 340/562 |
| 0153342 | 9/1984 | Japan | 379/61 |
| 0229432 | 11/1985 | Japan | 379/61 |
| 61-171230 | 8/1986 | Japan. | |
| 62-3546 | 1/1987 | Japan. | |
| 8503820 | 2/1985 | PCT Int'l Appl. . | |
| 2040524 | 8/1980 | United Kingdom | 340/562 |

OTHER PUBLICATIONS

Patent Abstracts of Japan, vol. 11, No. 171 (E-512)(2618) Jun. 2, 1987.
Patent Abstracts of Japan, vol. 10, No. 379 (E-465)(2436) Dec. 18, 1986.

Primary Examiner—James L. Dwyer
Assistant Examiner—Magdy Shehata
Attorney, Agent, or Firm—Sughrue, Mion, Zinn, Macpeak & Seas

[57] ABSTRACT

The telephone includes a touch sensor which may be attached on a handset. When the telephone receives a call meant therefor, the telephone alerts the user to the call by outputting a ringing tone through a speaker. In response to the call, the telephone also transmits a signaling tone to a base station which may be connected to the telephone over a radio channel and to a public switching telephone network. If the user touches the touch sensor in response to the ringing tone, the telephone stops the signaling tone and thus informs the base station that the user has responded to the call.

28 Claims, 3 Drawing Sheets

FIG. 3
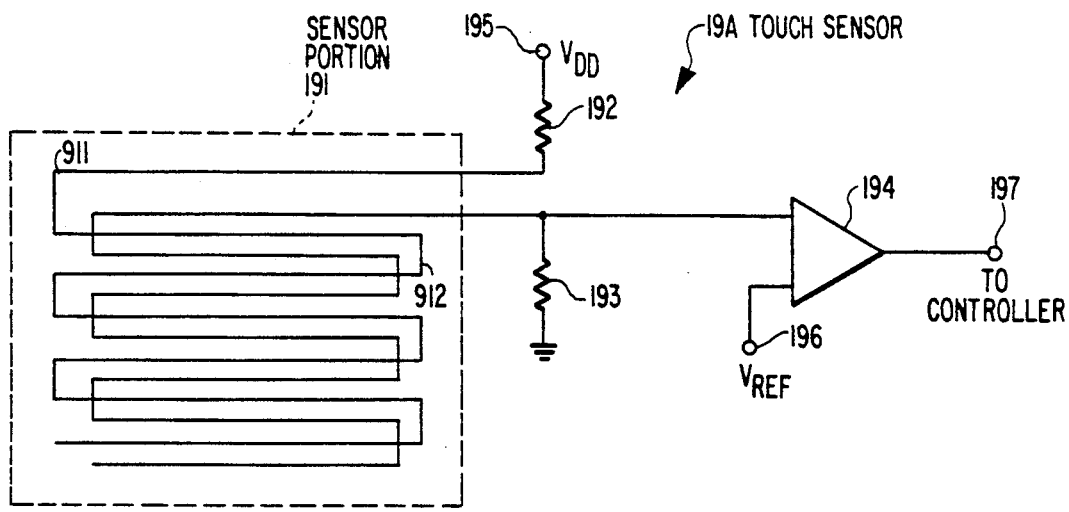
FIG. 5
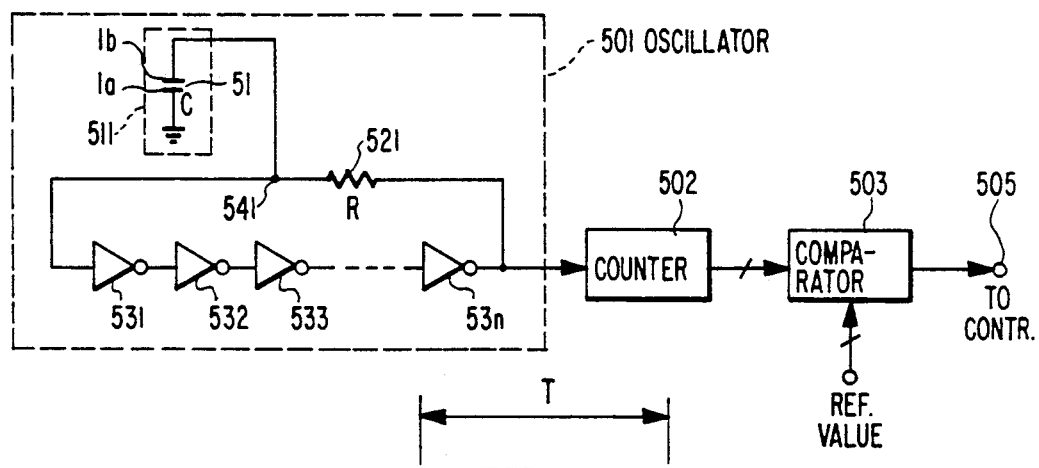

FIG. 6B

TELEPHONE HAVING TOUCH SENSOR FOR RESPONDING TO A CALL

This is a continuation of application Ser. No. 07/474,910 filed Feb. 5, 1990 now abandoned.

BACKGROUND OF THE INVENTION

The present invention relates to a telephone and, more particularly, to a telephone suitable for a mobile telephone system.

In a conventional telephone the user responds to a telephone call by picking up a handset or pressing a talk start button.

In the case of picking up the handset, a hook switch of the telephone is closed to inform a telephone exchange, which in a mobile telephone system may be connected to the telephone through a mobile base station, that the user of the telephone has responded to the call. If the user wants to use the telephone as a hands-free telephone, however, he does not need the handset; nevertheless, he must pick it up to connect the call.

Similarly, upon pressing the talk start button, the telephone informs the telephone exchange that the user has responded to a call. In this case, however, the user must search for the talk start button among many buttons provided on the telephone. This may hinder driving when the telephone is used in a vehicle.

SUMMARY OF THE INVENTION

An object of the present invention is, therefore, to provide an improved telephone which has a touch sensor to respond to a call.

Another object of the present invention is to provide a telephone in which the user can easily respond to a call by simply touching the telephone.

Yet another object of the present invention is to provide a telephone having a touch sensor to respond to a call in addition to a talk start button and to a hook switch.

Still yet another object of the present invention is to provide a telephone suitable for a mobile telephone system, which eliminates any trouble in responding to a call, while the user drives a vehicle in which the telephone is installed.

According to the present invention, there is provided a telephone comprising a speaker for annunciating a call meant for the telephone. The telephone also comprises a touch sensor which includes a sensor portion and detects whether the sensor portion is touched or not. Upon detecting a touch on the touch sensor, the telephone informs a telephone exchange that the user has responded to the call. The exchange then connects the telephone to a calling party telephone from which the call originated.

BRIEF DESCRIPTION OF THE DRAWINGS

Above and other objects, features and advantages of the present invention will become more apparent from the following description referring to the accompanying drawings in which:

FIG. 3 shows a schematic circuit diagram of a touch sensor to be used in the FIG. 1 telephone;

FIG. 5 is a schematic circuit diagram of another touch sensor to be used in the FIG. 1 telephone; and FIGS. 6A to 6E are used to show the operation of touch sensor 19B shown in FIG. 5.

DETAILED DESCRIPTION OF THE PREFERRED EMBODIMENTS

Figure 1:
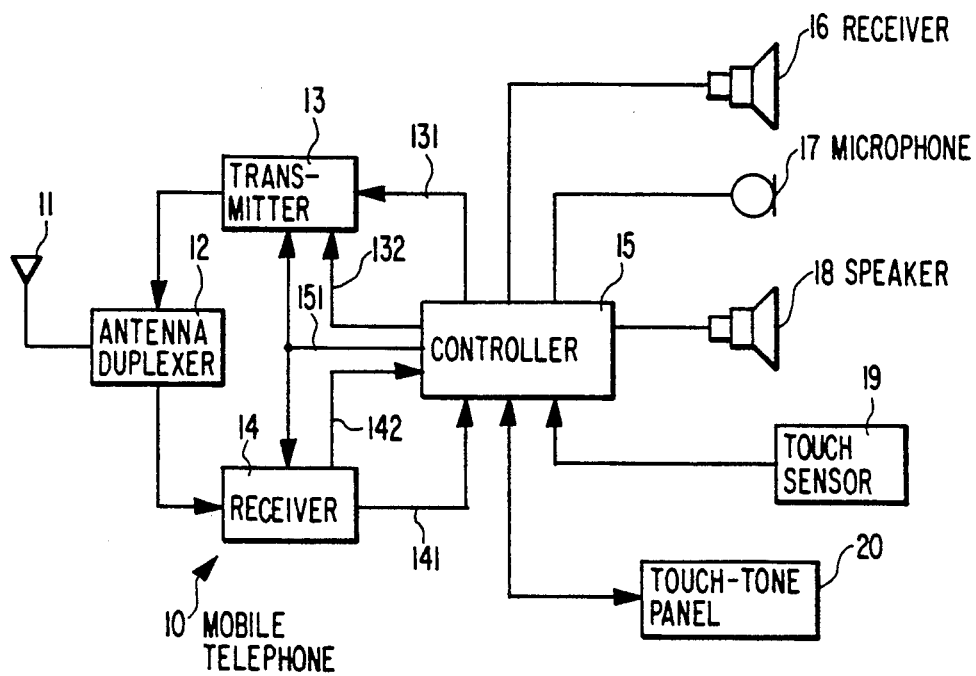
FIG. 1 is a block diagram showing a mobile telephone embodying the present invention.

In FIG. 1, a mobile telephone 10 is shown which may be used for a mobile telephone system. The mobile telephone 10 may be connected over a radio channel to a mobile base station which in turn may be connected to a telephone exchange included in a public switching telephone network (PSTN).

The mobile telephone 10 includes an antenna 11 for picking up a radio signal transmitted from the mobile base station (not shown). The antenna 11 is also used for transmitting a radio signal to the mobile base station. The antenna 11 is connected to both a transmitter 13 and a receiver 14 through an antenna duplexer 12. The transmitter 13 receives a speech, or voice, signal and a control signal from a controller 15 through conductor lines 131 and 132, respectively. The transmitter 13 modulates a radio frequency signal with the received speech signal and control signal and transmits the modulated signal to the base station through the antenna duplexer 12 and antenna 11.

The receiver 14 receives a radio frequency signal from the base station through the antenna 11 and antenna duplexer 12. The receiver 14 demodulates the received signal to provide the demodulated speech and control signals to the controller 15 through conductor lines 141 and 142, respectively. The controller 15 changes the channel frequencies of transmitter 13 and receiver 14 through a conductor line 151. The controller 15 may be composed of a commercially available microprocessor. The antenna 11, antenna duplexer 12, transmitter 13 and receiver 14 are well-known in the art and thus no further description of them will be given.

The mobile telephone 10 further comprises a receiver 16, microphone 17 and speaker 18 which are coupled to the controller 15. The receiver 16 and microphone 17 are used for a telephone conversation. The speaker 18 is used for annunciating a call to the user by outputting a ringing tone which is generated in the controller 15 in response to an alert signal, as will be described later. The receiver 16 and speaker 18 may be accommodated in an earpiece of a handset. The microphone 17 may be accommodated in a mouthpiece of the handset.

The telephone 10 includes a touch-tone panel 20 for dialing. The panel 20 may include a key pad and a display. The telephone also includes a touch sensor 19 which detects whether or not the user touches the telephone 10 in response to the ringing tone, i.e., in response to a call meant for him. By using the touch sensor 19, the user can respond to the call without resorting to picking up the handset or to pressing any key. It is to be noted that the user may also respond to a call by picking up the handset or by pressing a talk start key as in the prior art.

Figure 2:
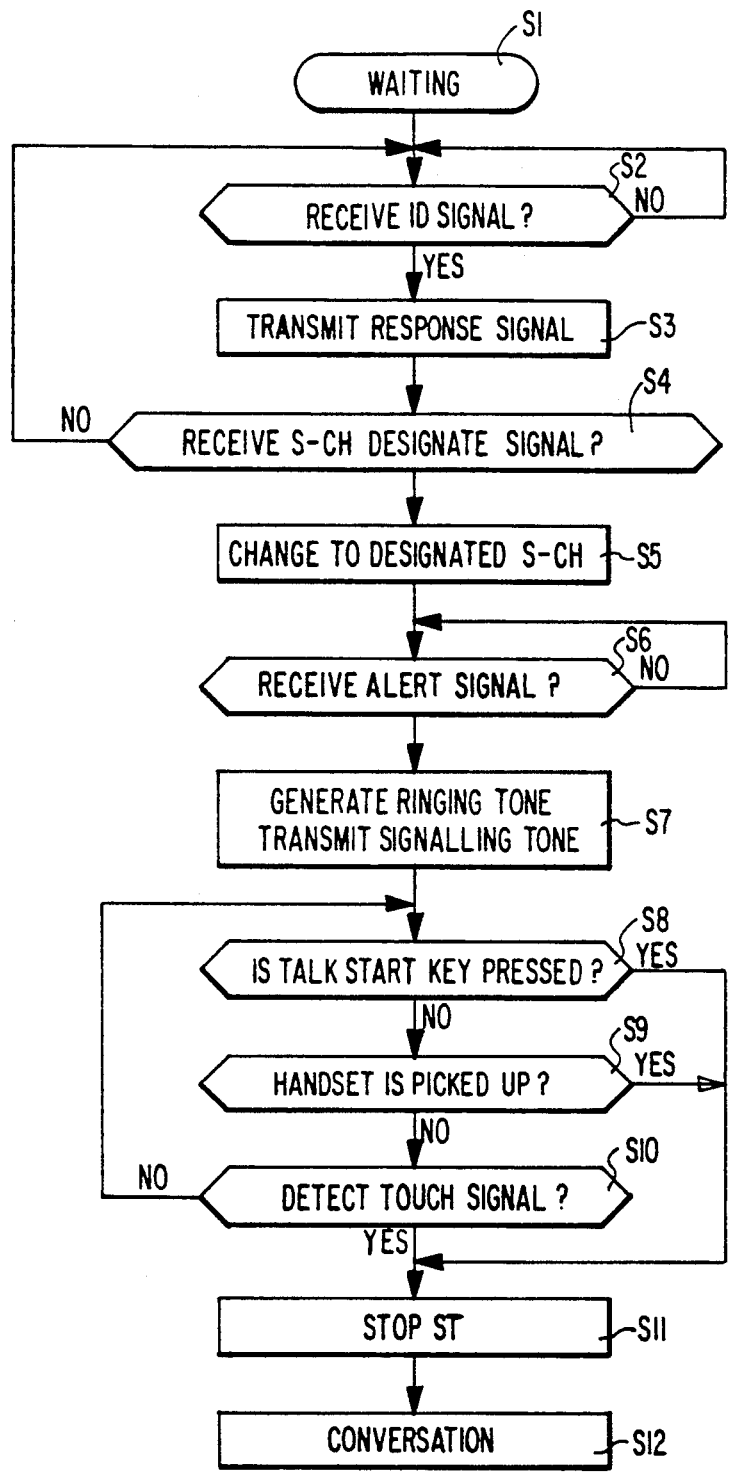
FIG. 2 is a flow-chart showing the operation of the FIG. 1 telephone.

Referring to FIG. 2, the operation of the controller 15 as shown in FIG. 1 will now be described in more detail. In a waiting state (step S1), the controller 15 causes the transmitter 13 and receiver 14 to tune to a paging channel over which a calling signal is transmitted from the mobile base station. The calling signal may include an identification (ID) number of the mobile telephone 10. If the telephone 10 receives the calling signal, i.e., the controller 15 detects the ID number of telephone 10 at step S2, the controller 15 transmits a call response signal to the base station at step S3. In response to reception of the response signal, the base station transmits a speech-channel designate signal which represents a speech channel designated to the telephone 10 for conversation.

If the controller 15 receives the speech-channel designate signal at step S4, the controller 15 proceeds to step S5. Otherwise, the controller 15 returns back to step S2. At step S5, the controller 15 causes the transmitter 13 and receiver 14 to tune to the designated speech channel. On this speech channel, the telephone 10 waits at step S6 for an alert signal which makes the controller 15 generate a ringing tone, and causes the speaker 18 to output the ringing tone (see step S7).

If the controller 15 receives the alert signal, it transmits a signaling tone (ST) to the base station (also see step S7). The ST informs the base station that the telephone 10 is annunciating a call to the user. When a talk start key in the touch-tone panel is pressed at step S8, the controller 15 moves on to step S11 at which the ST is stopped. If the talk start key is not pressed, step S8 is followed by step S9 at which the controller 15 sees if a handset is picked up. If the answer is affirmative, the operation proceeds to step S11. If it is negative, the operation moves on to step S10 at which the controller 15 monitors the output of touch sensor 19.

If the touch sensor 19 produces a detection signal indicating that the user touches the sensor 19, i.e., he responds to the call, the controller 15 goes on to step S11. Otherwise, the operation returns back to step S8. In response to the stoppage of ST, the mobile base station connects the mobile telephone 10 and a calling party for conversation. After step S11, the mobile telephone user enters conversation with the calling party (step S12). The operation after step S12 is the same as usual mobile telephone system and, therefore, such operation will be omitted in this specification.

In FIG. 3, a touch sensor 19A includes a sensor portion 191, resistors 192 and 193 and an operational amplifier 194. The sensor portion 191 is composed of conductive thin lines 911 and 912 which constitute a mesh and may be attached to a handset as will be described referring to FIG. 4. The resistor 192 is connected between one end of the line 911 and a terminal 195 to which a high voltage source $V_{DD}$ is applied. The resistor 193 is connected between one end of the line 912 and a non-inverted terminal of amplifier 194. An inverted terminal of amplifier 194 is connected to a terminal 196 to which a reference voltage $V_{REF}$ is applied. The output of amplifier 194 is provided to the controller 15 (FIG. 1).

The lines 911 and 912 are electrically separated from each other. When the user touches the sensor portion 191, the lines 911 and 912 are electrically connected to each other. As a result, a high voltage is applied to the non-inverted terminal of amplifier 194 from the terminal 195 through the resistor 192 and lines 911 and 912. The high voltage is set to be higher than the reference voltage $V_{REF}$. Thus, when the user touches the sensor portion 191, the amplifier 194 produces a high-level signal which is sent to the controller 15 as a detection signal. Otherwise, the amplifier 194 produces a low-level signal. As mentioned earlier, in response to the detection signal, the controller 15 determines that the user has responded to a call and then stops the transmission of the signaling tone.

Figure 4:
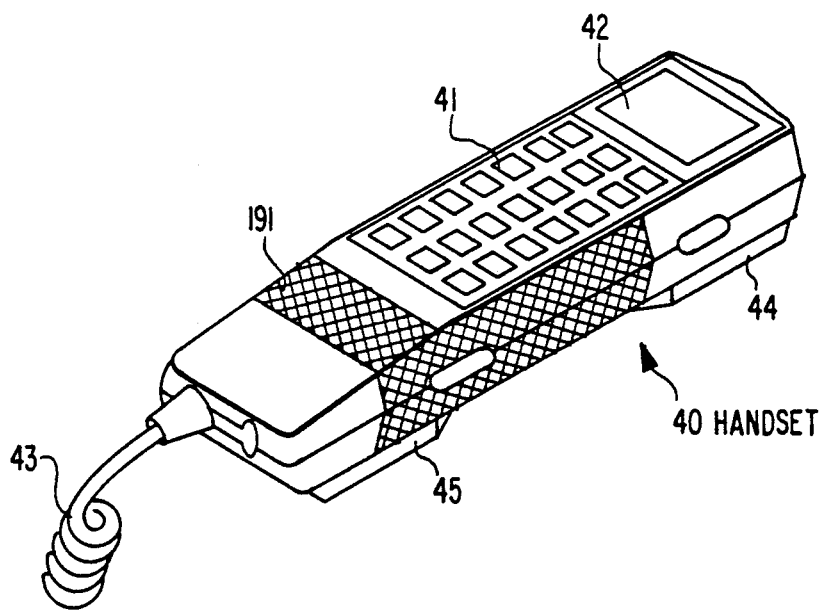
FIG. 4 is a perspective view of a handset on which the touch sensor shown in FIG. 3 is provided.

In FIG. 4, a handset 40 includes a sensor portion 191 attached on part of its surface. The handset 40 also includes a touch-tone panel having a key pad 41 and a display 42. The handset 40 further includes an earpiece 44 and mouthpiece 45. The earpiece may accommodate the receiver 16 and the speaker 18 (see FIG. 1). The mouth-piece 45 may accommodate the microphone 17 (FIG. 1). The handset 40 may electrically be connected to the controller 15 through a cord 43. The sensor portion, or mesh, 191 is attached to part of the handset surface, which part is so selected that the user can most conveniently touch thereon.

The touch sensor portion 191 may be attached to any part of a vehicle in which the mobile telephone 10 is installed. For example, the sensor portion 191 may be provided on the surface of a steering wheel.

In FIG. 5, another touch sensor 19B is shown which includes an oscillator 501, counter 502 and comparator 503. The oscillator 501 includes n cascaded inverters 53l–53n (n is the positive odd integer), sensor portion 511 and resistor 521 which is connected between the input of inverter 531 and the output of inverter 53n. The sensor portion 511 includes a capacitor 51 having two conductive plates 1a and 1b which are connected to ground and the input of inverter 531, respectively. If the user touches the plate 1a, the capacitance C of capacitor 51 increases. The plate 1a may be provided on the surface of handset 40 as the sensor portion 191 (FIGS. 3 and 4). Or the plate 1a may be attached to a steering wheel of a vehicle in which the telephone is used. The capacitor 51 and resistor 521 constitute a filter whose time constant is determined by the resistance R of resistor 521 and the capacitance C.

Figure 6A:
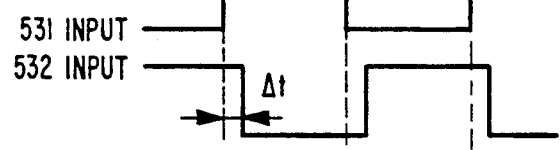
Figure 6C:
Figure 6D:
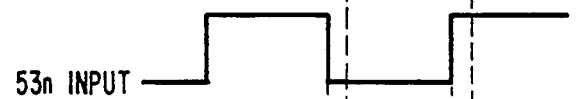
Figure 6E:

The operation of the touch sensor 19B will now be described referring to FIGS. 6A–6E. FIG. 6A shows an input waveform applied to the inverter 531 and FIG. 6B, an input waveform applied to the inverter 532. The waveform of FIG. 6B is delayed from the waveform of FIG. 6A by $\Delta t$. Likewise, each input waveform is delayed from the previous waveform by $\Delta t$, as shown in FIGS. 6C and 6D. The output (FIG. 6D) of inverter 53n passes the filter including the resistor 521 and the capacitor 51. FIG. 6E shows the output waveform of the filter which has a falling time $t_D$ and a rising time $t_U$. These times $t_D$ and $t_U$ are determined by the time constant of the filter and by the threshold levels $V_{DT}$ and $V_{UT}$ of inverter 531.

As can be seen from FIGS. 6A–6E, the period T of oscillation output is given by $$T = 2n\Delta t + t_D + t_U$$

Thus, the oscillation frequency f of oscillator 501 is written as $$f = 1/(2n\Delta t + t_D + t_U)$$

The falling and rising times $t_D$ and $t_U$ are represented as follows:

$$t_D = -CR \ln V_{DT}$$

$$t_U = -CR \ln (1 - V_{UT})$$

Then the frequency f will become $$f = 1/[2n\Delta t - CR \ln V_{DT}(1 - V_{UT})]$$

where $V_{DT}$ and $V_{UT}$ are smaller than one and thus $-CR \ln V_{DT}(1-V_{UT})$ is always positive. Therefore, if the capacitance C is changed, the oscillation frequency f can be changed. In other words, if the user touches the sensor portion 511, the capacitance C increases and thus the frequency f decreases.

The oscillation frequency f of oscillator 501 is counted by the counter 502. The counted number is applied to the comparator 503 through a parallel bus. The comparator 503 compares the counted number with a reference number applied thereto from a terminal 504 through a parallel bus. The comparator 503 provides a high-level output to the controller 15 (FIG. 1) when the counted number is smaller than the reference number; i.e., the user touches the sensor portion 511. Otherwise, the comparator 503 provides a low-level output to the controller 15. The comparator 503 may be composed of a device of $\mu$PD4063B manufactured and marketed by NEC.

What is claimed is:

1. A telephone comprising:
   first means for annunciating a call meant for said telephone;
   a touch sensor portion;
   second means for detecting whether said touch sensor portion is touched or not and for producing a detection signal when said touch sensor portion is touched; and
   third means responsive to said detection signal for causing said telephone to respond to said call only after the annunciation of said call.

2. A telephone as claimed in claim 1, wherein said annunciating means comprises means for generating a ringing tone and speaker means for outputting said ringing tone.

3. A telephone as claimed in claim 1, wherein said touch sensor portion comprises two conductive thin lines which are electrically separated from each other and constitute a mesh, one of said lines being connected to a voltage source, and wherein said second means comprises an operational amplifier having a non-inverted input terminal and or inverted input terminal which are connected to the other of said lines and to a reference voltage source, respectively, the output of said amplifier being outputted as said detection signal.

4. A telephone as claimed in claim 3, further comprising a handset having a surface, said mesh being attached to part of said surface.

5. A telephone as claimed in claim 1, further comprising:
   transmitter means coupled to said first and third means for transmitting a radio frequency signal which is modulated with a speech signal and a control signal; and
   receiver means coupled to said first and third means for receiving a radio frequency signal which is modulated with a speech signal and a control signal.

6. A telephone as claimed in claim 5, wherein said telephone is installed in a vehicle having a steering wheel, and wherein said touch sensor portion is attached to said steering wheel.

7. A mobile telephone comprising:
   means for detecting a calling signal meant for said mobile telephone to produce a first detection signal;
   means responsive to said first detection signal for transmitting a response signal;
   means for receiving a speech-channel designation signal which is transmitted from a base station in response to said response signal and which designates a speech channel to said mobile telephone to produce a received channel designation signal;
   means responsive to said received channel designation signal for tuning said mobile telephone to said speech channel;
   means for receiving an alert signal to produce a received alert signal;
   means response to said received alert signal for producing a ringing tone;
   means response to said received alert signal for transmitting a signaling tone;
   touch sensor means for producing a touch signal when being touched;
   means for detecting said touch signal to produce a second detection signal; and
   means responsive to said second detection signal for stopping the transmission of said signaling tone only after the reception of said alert signal.

8. A telephone comprising:
   first means for detecting a call;
   second means responsive to the output of said first means for producing an annunciate signal;
   third means having a sensor portion for producing a touch signal when said sensor portion is touched; and
   fourth means responsive to said touch signal for responding to said call, only after the production of said annunciation signal.

9. A telephone as claimed in claim 8, further comprising a handset having a surface, wherein said sensor portion comprises a mesh attached to part of said surface.

10. A telephone as claimed in claim 8, wherein said telephone is installed in a vehicle having a steering wheel, and wherein said sensor portion is attached to said steering wheel.

11. A telephone as claimed in claim 8, wherein said sensor portion comprises first and second conductive lines which are electrically separated from each other and constitute a mesh, and wherein said third means comprises a high voltage source connected to said first conductive line and an operational amplifier having non-inverted and inverted inputs which are connected to said second conductive line and to a reference voltage source, respectively, for outputting an output as said touch signal when a voltage applied to said non-inverted input is higher than the voltage of said reference voltage source.

12. An apparatus comprising:
   means for communicating with other parties;
   means connected to said communicating means for annunciating a reception of a call;
   touch sensor means for sensing human being's touch thereon; and
   means responsive to the output of said touch sensor means for making said apparatus respond to said call only after the annunciation of reception of said call.

13. An apparatus as claimed in claim 12, wherein said communicating means comprises a receiver and a microphone for telephone conversation; and a handset for accommodating said receiver and microphone, and wherein said touch sensor means is attached to the surface of said handset.

14. An apparatus as claimed in claim 13, wherein said touch sensor means comprises a conductive mesh.

15. An apparatus as claimed in claim 13, wherein said annunciating means comprises a speaker installed in said handset.

16. An apparatus as claimed in claim 13, wherein said communicating means further comprises transmitter means for transmitting the output of said microphone over a radio frequency; and receiver means for receiving a radio frequency signal and demodulating the received signal to provide a demodulated signal to said receiver.

17. An apparatus as claimed in claim 16, wherein said apparatus is installed in a vehicle.

18. An apparatus as claimed in claim 17, wherein said vehicle has a steering wheel, said touch sensor means being attached to said steering wheel.

19. A method of making a telephone respond to a call addressed thereto, comprising the following steps of:
   annunciating a reception of said call;
   producing a touch detection signal when a touch sensors touched; and
   responsive to said touch detection signal, making said telephone respond to said call only after the annunciation of said call.

20. A method as claimed in claim 19, further comprising the step of, responsive to said reception of said call, transmitting a signaling tone, wherein said step of making said telephone respond to said call comprises the step of stopping the transmission of said signaling tone.

21. A method of making a mobile telephone respond to a call meant therefor, comprising the following steps of:
   detecting a call signal to produce a first detection signal;
   responsive to said first detection signal, transmitting a call response signal;
   receiving a channel designation signal which is transmitted from a base station in response to said call response signal and which designates a speech channel to said mobile telephone;
   responsive to said channel designation signal, tuning said mobile telephone to said speech channel;
   receiving an alert signal;
   responsive to the received alert signal, generating a ringing tone;
   responsive to said received alert signal, transmitting a signaling tone;
   producing a second detection signal when a touch sensor is touched; and
   responsive to said second detection signal, stopping the transmission of said signaling tone only after the reception of said alert signal.

22. A method as claimed in claim 21, further comprising the steps of:
   producing a third detection signal when a particular key is pressed; and
   responsive to said third detection signal, stopping the transmission of said signaling tone.

23. A telephone as claimed in clam 1, further comprising a handset, wherein said touch sensor portion comprises a capacitor having two conductive plates one of which is attached to the surface of said handset, and the other of which is attached to a ground potential.

24. A telephone as claimed in claim 1, wherein said touch sensor portion comprises a capacitor having two conductive plates, and wherein said second means comprises an oscillator in which said capacitor is included; a counter for counting the output frequency of said oscillator to produce a counted number; and a comparator for comparing said counted number with a reference number to produce an output as said detection signal.

25. An apparatus as claimed in claim 12, wherein said touch sensor means comprises oscillator means including a capacitor which has two conductive plates for generating an oscillation signal whose frequency is changed by human being's touch on one of said two conductive plates; counter means for counting the frequency of said oscillation signal to produce a counted number; comparator means for comparing said counted number with a reference number to produce an output as said output of said touch sensor means.

26. An apparatus as claimed in claim 25, further comprising a handset, wherein one of said conductive plates is connected to ground and attached to the surface of said handset.

27. A method as claimed in claim 19, further comprising the steps of producing a key signal when a talk start key is pressed; and responsive to said key signal, making said telephone respond to said call.

28. A method as claimed in claim 22, further comprising the step of, responsive to the stoppage of transmission of said signaling tone, connecting said mobile telephone to a telephone from which said call has been made.

* * * * *

UNITED STATES PATENT AND TRADEMARK OFFICE
CERTIFICATE OF CORRECTION

PATENT NO. : 5,329,577
DATED : July 12, 1994
INVENTOR(S) : Hidehiko Norimatsu

It is certified that error appears in the above-identified patent and that said Letters Patent is hereby corrected as shown below:

Column 4, line 20, delete "53l" and insert --531--.

Signed and Sealed this

Eighteenth Day of October, 1994

*Attest:*

BRUCE LEHMAN

*Attesting Officer*   Commissioner of Patents and Trademarks